US012574660B2

(12) United States Patent     (10) Patent No.:    US 12,574,660 B2

Olsson Picalausa            (45) Date of Patent:     Mar. 10, 2026

---

(54) IMAGE SENSOR WITH VOLTAGE MONITORING CIRCUIT

(71) Applicant: Sony Semiconductor Solutions Corporation, Atsugi (JP)

(72) Inventor: Jenny Anna Maria Olsson Picalausa, Stuttgart (DE)

(73) Assignee: SONY SEMICONDUCTOR SOLUTIONS CORPORATION, Atsugi (JP)

( * ) Notice: Subject to any disclaimer, the term of this patent is extended or adjusted under 35 U.S.C. 154(b) by 142 days.

(21) Appl. No.: 18/568,482

(22) PCT Filed: Jun. 9, 2022

(86) PCT No.: PCT/EP2022/065649
§ 371 (c)(1),
(2) Date: Dec. 8, 2023

(87) PCT Pub. No.: WO2022/263272
PCT Pub. Date: Dec. 22, 2022

(65) Prior Publication Data
US 2024/0284067 A1     Aug. 22, 2024

(30) Foreign Application Priority Data

Jun. 16, 2021    (EP) .................................... 21179727

(51) Int. Cl.
*H04N 25/709*      (2023.01)
*G01R 19/252*      (2006.01)
(52) U.S. Cl.
CPC ......... *H04N 25/709* (2023.01); *G01R 19/252* (2013.01)

(58) Field of Classification Search
None
See application file for complete search history.

(56) References Cited

U.S. PATENT DOCUMENTS

| | | | | | |
|---|---|---|---|---|---|
| 4,616,173 | A | * | 10/1986 | Cook | ...................... G01R 23/10 |
| | | | | | 324/76.62 |
| 2011/0074398 | A1 | * | 3/2011 | Barton | ................. G01R 19/252 |
| | | | | | 324/133 |
| 2014/0362273 | A1 | * | 12/2014 | Okura | .................... H04N 25/76 |
| | | | | | 348/308 |

FOREIGN PATENT DOCUMENTS

| | | |
|---|---|---|
| EP | 3758366 A1 | 12/2020 |
| WO | 2017120242 A1 | 7/2017 |

OTHER PUBLICATIONS

Yingkayun et al., "A power quality monitoring system for real-time detection of power fluctuations", IEEE Conference Publication, Sep. 28-30, 2008, 2 pages.

(Continued)

*Primary Examiner* — Jas A Sanghera
(74) *Attorney, Agent, or Firm* — XSENSUS LLP

(57) ABSTRACT

An image sensor includes a voltage controlled oscillator and an evaluation circuit. The voltage controlled oscillator outputs a periodic signal, wherein a frequency of the periodic signal is a function of an input voltage signal at an oscillator input of the voltage controlled oscillator. The input voltage signal is derived from an internal constant voltage signal of the image sensor. The evaluation circuit outputs a notification signal when a frequency of the periodic signal fulfills a predetermined condition.

20 Claims, 11 Drawing Sheets

(56)                    References Cited

OTHER PUBLICATIONS

Miyake et al., "Temperature and Voltage Estimation Using Ring-Oscillator-Based Monitor for Field Test", IEEE 23rd Asian Test Symposium, downloaded on Jul. 6, 2020, pp. 156-161.
"IR Drop—Semiconductor Engineering", Jun. 1, 2021, pp. 1-2.
Abdullah et al., "Real-Time Power Quality Monitoring System Based on TMS320CV5416 DSP Processor", Conference Paper, Oct. 9, 2014, pp. 1668-1672.
International Search Report and Written Opinion mailed on Sep. 13, 2022, received for PCT Application PCT/EP2022/065649, filed on Jun. 9, 2022, 11 pages.

* cited by examiner 200                                                                    10

BPD

910

OPN

920

23020

IMAGE SENSOR WITH VOLTAGE MONITORING CIRCUIT

CROSS-REFERENCE TO RELATED APPLICATIONS

The present disclosure is based on PCT filing PCT/EP2022/065649, filed Jun. 9, 2022, which claims priority from European Patent Application No. 21179727.9, filed Jun. 16, 2021, the entire contents of each are incorporated herein by reference.

The present disclosure relates to an image sensor with a voltage monitoring circuit that monitors a constant voltage signal. More specifically, the disclosure relates to a safety controller that monitors internal constant voltage signals in CMOS image sensor assemblies.

BACKGROUND

Active image sensors in solid-state imaging devices include photoelectric conversion elements that generate a photocurrent whose current rating is proportional to the received radiation intensity. In intensity readout image sensors, a pixel circuit converts the small photocurrent generated by the photoelectric conversion element into a comparatively large pixel output signal which a downstream analog-to-digital converter converts into a digital pixel value. Pixel circuits for event detection sensors such as Dynamic Vision Sensors (DVS) and Event-based Vision Sensors (EVS) respond to changes in light intensity and the image sensor provides information about the position of the changes in the imaged scene. Regardless of the type of image sensor, the circuitry that processes and evaluates the photocurrent requires constant voltage signals for proper operation of amplifiers and comparators. Fluctuations of the constant voltage signals influence the evaluation of the photocurrent.

SUMMARY

Nowadays, there is a constant need for image sensors with a safety mechanism that allows monitoring of the power supply voltage and/or other constant voltage signals. In particular, a CIS (CMOS Image Sensor) should be able to detect on its own whether the amplitude of a supply voltage and/or another voltage signal with nominally constant voltage amplitude is within a predetermined tolerance window for the acquisition period of an image, or whether oscillations or momentary voltage spikes on such constant voltage signals may have affected the acquired image content. The present disclosure has been made in view of the above circumstances, and it is therefore desirable to provide an image sensor which facilitates analysis and evaluation of image sensor functionality.

In this regard, the present disclosure relates to an image sensor that includes a voltage controlled oscillator. The voltage controlled oscillator outputs a periodic signal, wherein a frequency of the periodic signal is a function of an input voltage signal at an oscillator input of the voltage controlled oscillator. The input voltage signal is derived from an internal constant voltage signal of the image sensor. An evaluation circuit outputs a notification signal when a frequency of the periodic signal fulfills a predetermined condition.

The described embodiments, together with further advantages, will be best understood by reference to the following detailed description taken in conjunction with the accompanying drawings.

BRIEF DESCRIPTION OF THE DRAWINGS

FIG. 10 is a diagram showing an example of a laminated structure of a solid-state imaging device according to an embodiment of the present disclosure.

DETAILED DESCRIPTION

Examples for implementing techniques of the present disclosure (also referred to as "embodiments" in the following) will be described below in detail using the drawings. The techniques of the present disclosure are not limited to the embodiments, and various numerical values and the like in the embodiments are illustrative. The same elements or elements with the same functions are denoted by the same reference signs, and duplicate descriptions are omitted.

Electrically connected electronic elements may be electrically connected through a direct, permanent low-resistive connection, e.g., through a conductive line. The terms "electrically connected" and "signal connected" may also include a connection through other electronic elements provided and suitable for permanent and/or temporary signal transmission and/or transmission of energy. For example, electronic elements may also be electrically connected and signal connected through electronic switches such as transistor switches, transistors or transistor circuits, e.g. FETs (field effect transistors), FET circuits, transmission gates, and others.

Though in the following a technology for improving reliability of image sensor assemblies are mainly described in the context of certain types of active image sensors for intensity read-out, the technology may also be used for other types of active image sensors, e.g. image sensors for event-based vision.

Figure 1:
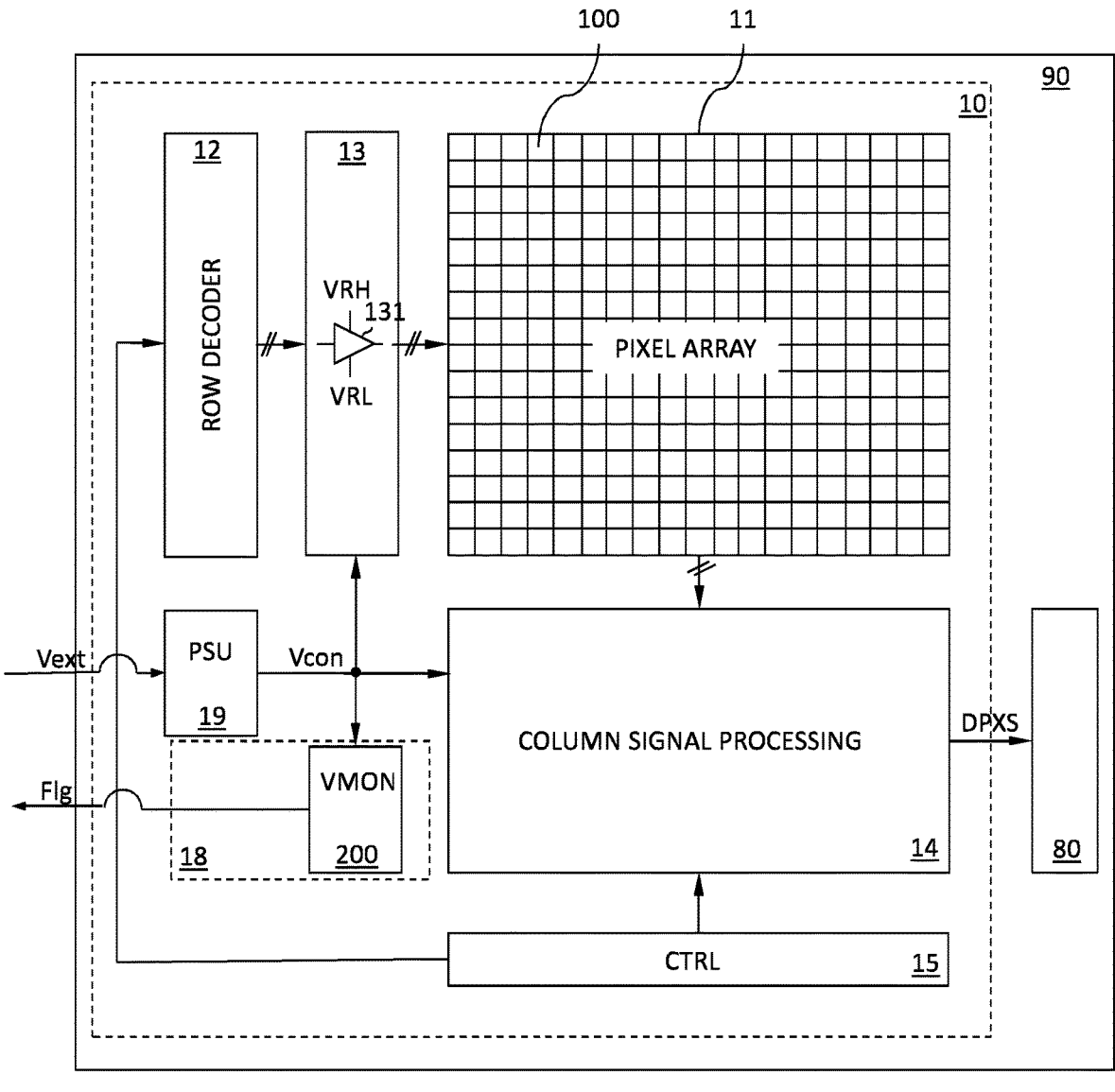
FIG. 1 is a simplified block diagram illustrating a configuration example of a solid-state imaging device with an image sensor that includes a voltage monitoring circuit with a voltage controlled oscillator according to an embodiment of the present technology.

FIG. 1 illustrates a configuration example of a solid-state imaging device 90 including an image sensor assembly 10 and a signal processing unit 80 according to an embodiment of the present technology.

The image sensor assembly 10 may include a pixel array unit 11, a row decoder 12, a row driver assembly 13, a column signal processing unit 14 with a readout circuit and a horizontal driving circuit, and a sensor controller 15.

The pixel array unit 11 includes a plurality of pixel circuits 100. Each pixel circuit 100 includes a photoelectric conversion element and a number of pixel transistors for controlling the signal output by the photoelectric conversion element. The pixel circuits 100 may be any active pixel sensors adapted for intensity readout or for event detection. The pixel transistors are FETs, e.g. MOSFETs (metal oxide semiconductor field effect transistors).

The pixel array unit 11 may be a one-dimensional pixel array with the photoelectric conversion elements of all active pixel circuits 100 arranged along a straight or meandering line (line sensor) in a semiconducting pixel substrate. In particular, the pixel array unit 11 may be a two-dimensional array, wherein the photoelectric conversion elements of the pixel circuits 100 may be arranged along straight or meandering rows and along straight or meandering lines in a horizontal plane of the semiconducting pixel substrate.

The pixel circuits 100 may be connected along columns and along rows. A subset of pixel circuits 100 assigned to the same row form a pixel row. The pixel circuits 100 of the same pixel row may share common control lines and may be addressed synchronously. A subset of pixel circuits 100 assigned to the same column form a pixel column. The pixel circuits 100 of the same pixel column share at least one common data signal line (e.g. vertical signal line). The pixel output signals of the pixel circuits 100 of the same pixel column may be successively passed to the same data signal line per a time division multiplexing method.

The row decoder 12 and the row driver assembly 13 control driving of each pixel circuit 100 of the pixel array unit 11. In particular, the row decoder 12 may supply one or more control signals for designating the pixel circuit 100 or the pixel row to be controlled to the row driver assembly 13 according to an address signal from the sensor controller 15. The row driver assembly 13 may drive the pixel transistors of the pixel circuit 100 according to driver timing signals supplied from the sensor controller 15 and the control signals supplied from the row decoder 12.

The row driver assembly 13 may include one or more buffer circuits 131 per pixel row. Alternatively, two or more pixel rows or all pixel circuits 100 may share one, some or all of the buffer circuits 131.

Data signal lines pass the output signals of the pixel circuits 100 (pixel output signals) to the readout circuit of the column signal processing unit 14.

The readout circuit may include one or more ADCs (analog-to-digital converters). The readout circuit may include as much ADCs as the pixel array unit 11 includes data signal lines or pixel columns. Alternatively, the number of ADCs may be lower than the number of pixel columns, wherein each ADC may be multiplexed between two or more of the data signal lines. Each ADC performs an analog-to-digital conversion on the pixel output signals successively read out from the respective pixel column. To this purpose, each ADC may include a comparator, a digital-to-analog converter (DAC) and a counter to convert each pixel output signal into digital pixel data DPXS.

The horizontal driving circuit of the column signal processing unit 14 controls the elements of the readout circuit to pass the pixel data DPXS of the pixel columns to the signal processing unit 80. For pixel circuits 100 implementing event detection alternatively or in addition to the intensity readout, the readout circuit may include latches, registers, or other memory elements for temporarily storing event data and/or pixel addresses of pixel circuits having detected an event.

The sensor controller 15 controls the other components of the image sensor assembly 10. For example, the sensor controller 15 may supply the address to the row decoder 12 and may supply driving timing signals to the row driver assembly 13. In addition, the sensor controller 15 may supply one or more control signals for controlling the column signal processing unit 14, e.g. the horizontal driving circuit and the ADCs in the readout circuit.

A supply voltage interface 19 supplies one or more internal constant voltage signals Vcon to the other components of the image sensor 10. The internal constant voltage signals Vcon may include internal supply voltages, particularly for components of the row driver assembly 13 and for the column signal processing unit 14. During operation of the image sensor 10, the amplitude of the internal supply voltages is nominally constant and changes only as a result of disturbances. The internal constant voltage signals Vcon may also include quasi-static square wave signals with comparatively long active periods.

In particular, the supply voltage interface 19 may include an electric interface that receives one or more external supply voltages Vext from outside the image sensor 10. The electric interface may include a dis-connectable physical contact, a hard-wired contact, or a receiver device for wireless power transfer, by way of example. The supply voltage interface 19 may include one or more constant voltage supply circuits obtaining at least one of the internal constant voltage signals Vcon from one or more of the received external supply voltages Vext. Alternatively, the supply voltage interface 19 may pass the external supply voltage(s) Vext as internal constant voltage signal(s) Vcon to the components of the image sensor 10.

A safety controller 18 includes one or more voltage monitoring circuits 200. Each voltage monitoring circuit 200 monitors at least one of the internal constant voltage signals Vcon supplied by the supply voltage interface 19, e.g. the internal supply voltages for the ADCs of the column signal processing unit 14 and/or for one or more of the buffer circuits 131 of the row driver unit 140.

The present disclosure relates to the safety controller 18, and, more particularly to the voltage monitoring circuits 200. Each voltage monitoring circuit 200 is based on a VCO (voltage controlled oscillator) whose output frequency is a function of the monitored voltage. Within a fixed count period, the complete oscillations (signal periods) of the oscillator are counted and the result is compared with a static or dynamic reference number. If the counted number of oscillations deviates too much from the reference number, then the voltage monitoring circuit 200 outputs an active notification signal Flg.

Figure 2:
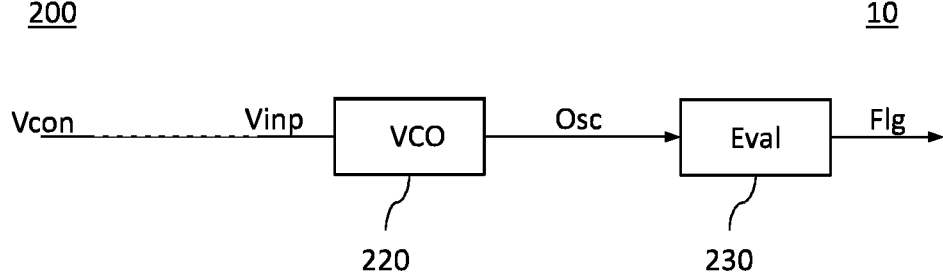
FIG. 2 is a simplified block diagram illustrating a configuration example of a voltage monitoring circuit with a voltage controlled oscillator according to an embodiment of the present technology.

FIG. 2 shows a part of an image sensor 10 with a voltage monitoring circuit 200, wherein the voltage monitoring circuit 200 includes a voltage controlled oscillator 220 and an evaluation circuit 230. The voltage controlled oscillator 220 outputs a periodic signal Osc. A frequency of the periodic signal Osc is a function of an input voltage signal Vinp passed to an oscillator input (control voltage input) of the voltage controlled oscillator 220. The input voltage signal Vinp is derived from an internal constant voltage signal Vcon of the image sensor 10. The evaluation circuit 230 outputs a notification signal Flg when a frequency of the periodic signal Osc fulfills a predetermined condition.

The active notification signal Flg can be used during operation in a target application to inform the user and/or a higher-level process entity, e.g. a host processor, of the possibility that the current image information may be erroneous and based in part on pixel circuits or a readout circuit that are not operating correctly. For example, in the field of digital vision a host processor may consider information provided by the active notification signal Flg to modify motion estimation routines accordingly and/or may inform the user and/or a service control station.

In particular, the frequency of the periodic signal Osc is a function of the amplitude of the input voltage signal Vinp and the input voltage signal Vinp is identical or proportional to an internal constant voltage signal Vcon. The internal constant voltage signal Vcon is a nominally constant voltage signal, i.e. a DC voltage signal with an amplitude which, at least for a certain time of interest, is constant in the ideal case. A tolerance window for the amplitude of the internal constant voltage signal Vcon is small compared to the nominal voltage amplitude. The internal constant voltage signal Vcon may be a power supply voltage passed e.g. to the drain side of an nFET in a voltage follower circuit or to the drain side of the upper pFET in a CMOS inverter circuit.

The voltage controlled oscillator may include active circuits supplied through an internal supply voltage applied between a positive supply input and a negative supply input of the voltage controlled oscillator, wherein a voltage-to-frequency transfer characteristic is to a comparatively high degree independent form fluctuations of the internal supply voltage.

The voltage controlled oscillator 220 may be, e.g., a harmonic oscillator or a relaxation-type oscillator. In particular, the voltage controlled oscillator 220 may include an oscillator circuit whose frequency-determining element can be varied electrically by the input voltage signal Vinp applied to the oscillator input. For example, the oscillator input sets the diode bias voltage and thus the capacitance of a diode in an LC oscillator circuit and varying the diode capacitance changes the resonant frequency of the LC oscillator circuit. Alternatively, the voltage controlled oscillator 220 may include an operational amplifier integrating the control voltage applied to the oscillator input and resetting the integrated voltage when the integrated voltage reaches a threshold value.

The periodic signal Osc may have a sinusoidal waveform, a sawtooth waveform, or a triangular waveform or may be a binary square wave signal, wherein a duty cycle may be between 0 and 1, e.g. approximately 0.5. For example the periodic signal Osc includes periodic pulses.

The evaluation circuit 230 compares the frequency of the periodic signal Osc with at least one reference frequency. For example, the evaluation circuit 230 compares the frequency of the periodic signal Osc with an upper boundary frequency and with a lower boundary frequency and outputs an active notification signal Flg when the frequency of the periodic signal Osc exceeds the upper boundary frequency or falls below the lower boundary frequency. The upper boundary frequency and the lower boundary frequency image the voltage tolerance window of the internal constant voltage signal Vcon.

The output signal of the evaluation circuit 230 may be a binary square wave signal, with the low level indicating a permissible frequency range and the high level indicating an erroneous frequency.

The voltage monitoring circuit 200 can be used to monitor input voltages of an ASIC (application specific integrated circuit) as well as monitoring critical voltages that are crucial for the operation of the image sensor 10, such as, but not limited to, internal reference voltages, voltage drops on internal power rails ("IR drops"), and output voltages of internal voltage regulators.

With a CIS (CMOS image sensor), fluctuations of some of the image sensor's nominal constant voltage signals can directly affect image quality, resulting in critical but temporary errors in the captured image. These fluctuations may only occur for a very short portion of the image acquisition time (exposure time). While solutions that use ADCs to monitor nominally constant voltage signals, reliably detect only such fluctuations that last for an extended period of time and do not detect short-term fluctuations, the voltage monitoring circuit 200 according to the embodiments is capable of detecting even very short spikes and dips. Since the voltage monitoring circuit 200 requires comparatively little space on a semiconducting substrate, the safety controller 18 may include a plurality of the voltage monitoring circuits 200, for example, one for each of the internal constant voltage signals Vcon used in the image sensor 10. The voltage monitoring circuit 200 provides a module for a low-cost voltage monitor system that can detect anomalies within a given time frame.

Figure 3:
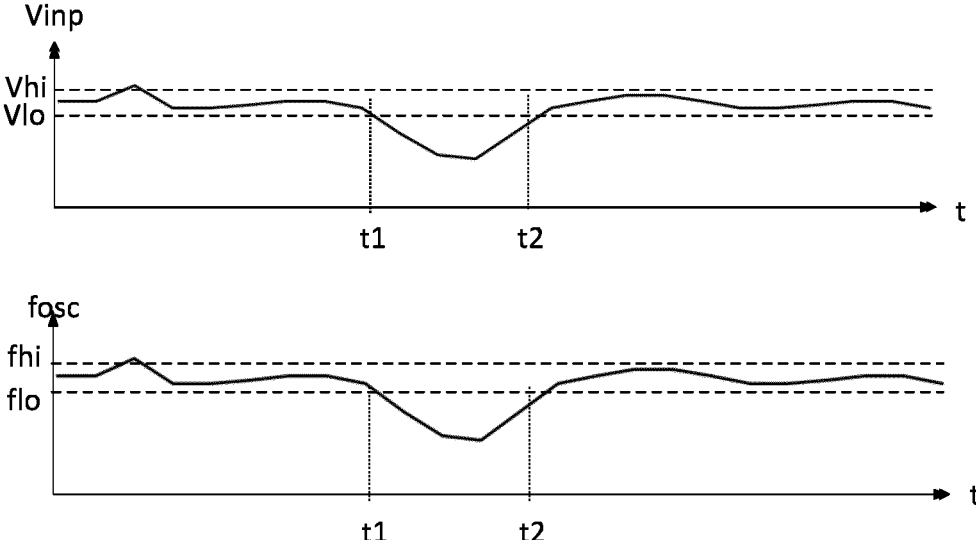
FIG. 3 includes schematic time diagrams to discuss the operation of a voltage monitoring circuit with voltage controlled oscillator as shown in FIG. 2.

The time diagram in the upper half of FIG. 3 shows a monitored input voltage signal Vinp fluctuating with time. Between t=t1 and t=t2 the monitored input voltage signal Vinp drops below a lower threshold Vlo of a tolerance window between a lower threshold Vlo and an upper threshold Vhi.

The time diagram in the lower half of FIG. 3 shows a corresponding frequency window with a lower frequency threshold flo given by the frequency of the periodic signal Osc at a monitored input voltage signal Vinp equal to the lower threshold Vlo of the monitored input voltage signal Vinp and the frequency fhi of the periodic signal Osc at an input voltage signal Vinp equal to the higher threshold Vhi of the monitored input voltage signal Vinp. The frequency fosc of the periodic signal Osc is directly correlated to the amplitude of the monitored input voltage signal Vinp. The frequency fosc images the time response of the input voltage signal Vinp and between t=t1 and t=t2 the frequency fosc drops below lower frequency threshold flo.

Figure 4:
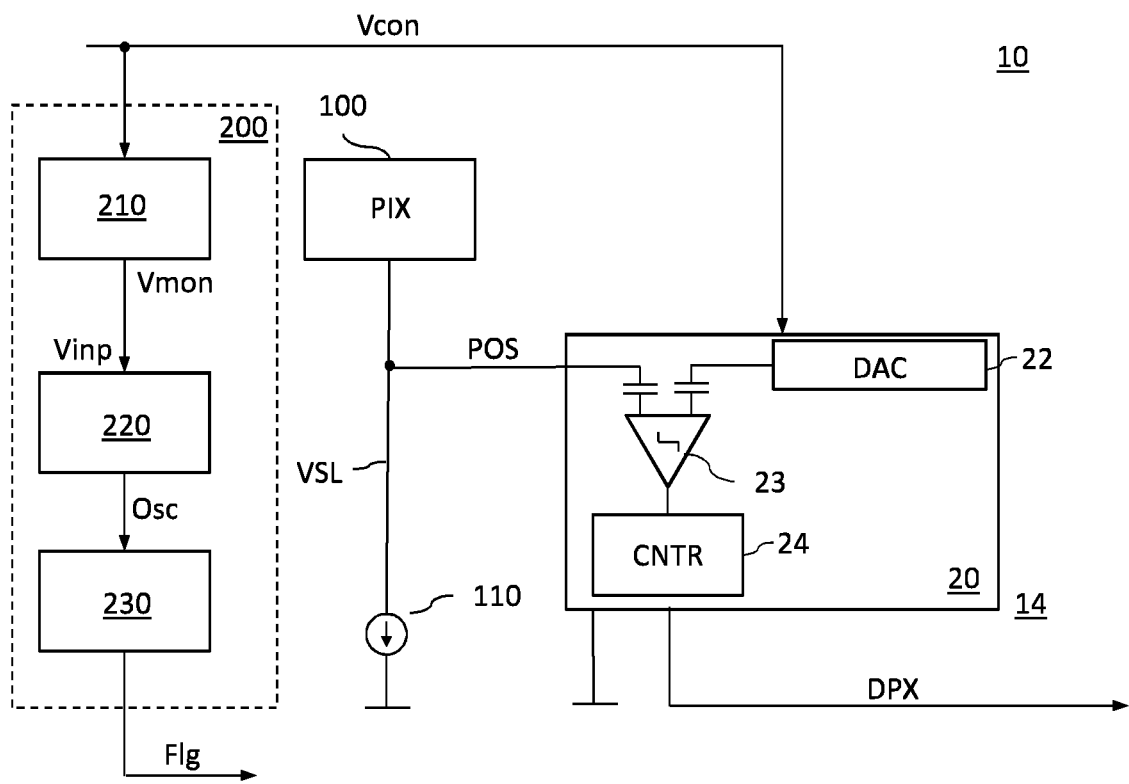
FIG. 4 is a simplified block diagram illustrating a configuration example according to an embodiment of the present technology with a voltage monitoring circuit monitoring a supply voltage used in a read-out circuit of a pixel circuit for intensity readout.

In FIG. 4 the image sensor 10 includes a pixel circuit 100 wherein the internal constant voltage signal Vcon is used to control the pixel circuit 100 and/or to analyze a pixel output signal POS of the pixel circuit 100. The voltage monitoring circuit 200 includes a voltage interface circuit 210. The voltage interface circuit 210 derives the input voltage signal Vinp from the internal constant voltage signal Vcon.

For example, a data signal line VSL electrically connects the source side of a source follower circuit in the pixel circuit 100 with a constant current source 110 and passes an analog pixel output signal POS to an ADC unit 20. An internal constant voltage signal Vcon supplies the ADC unit 20. The ADC unit 20 converts the analog pixel output signal POS to a digital pixel value DPX. The ADC unit 20 may include a digital-to-analog converter 22. The output voltage swing of the digital-to-analog converter 22 may depend to some degree from the amplitude of the ADC unit supply voltage, i.e. from the amplitude of the internal constant voltage signal Vcon. Fluctuations of the amplitude of the internal constant voltage signal Vcon may influence the digital pixel value DPX.

A voltage monitoring circuit 200 as described above may be used to get information about possibly faulty digital pixel values DPX.

As for the internal constant voltage signal Vcon, a supply voltage interface may pass an external supply voltage as the internal constant voltage signal Vcon to the ADC unit 20. Alternatively, the supply voltage interface may include a constant voltage source that transforms an external supply voltage into the internal constant voltage signal Vcon.

The voltage monitoring circuit 200 includes a voltage interface circuit 210 that receives the internal constant voltage signal Vcon. The voltage interface circuit 210 may pass the internal constant voltage signal Vcon as monitored voltage signal Vmon to the voltage controlled oscillator 220 or may transform the constant voltage signal Vcon to the as monitored voltage signal Vmon. The monitored voltage signal Vmon is at least temporarily passed to the input of the voltage controlled oscillator 220.

The voltage interface circuit 210 may be a passive circuit that generates the monitored voltage signal Vmon as a linearly attenuated version of the constant voltage signal Vcon.

Figure 5:
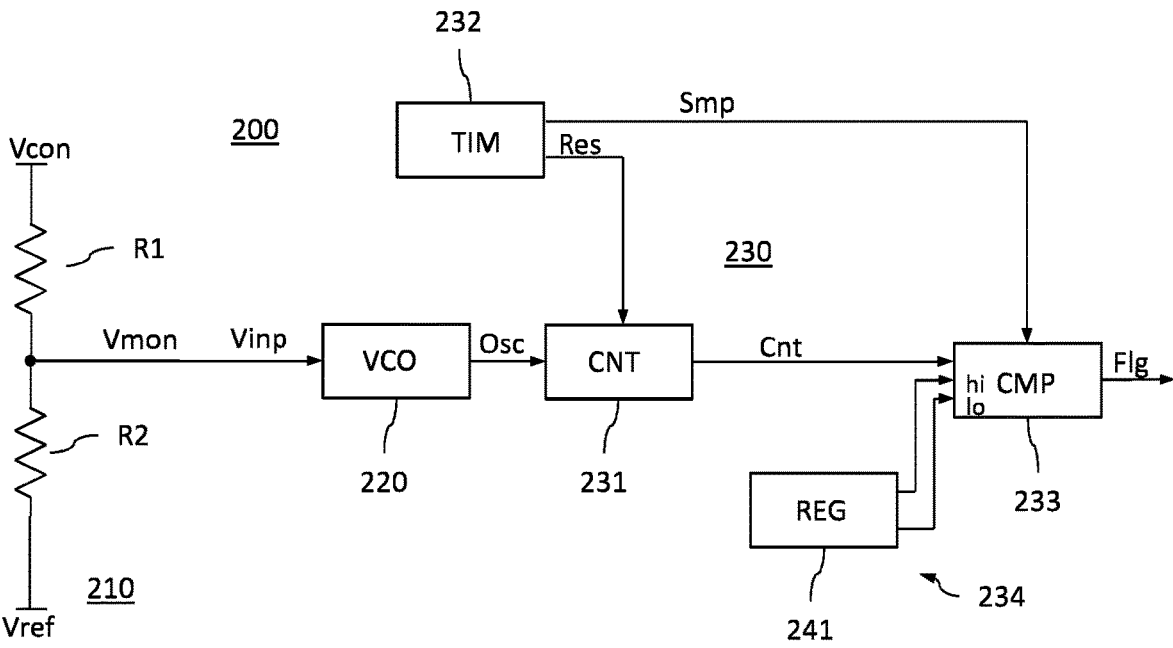
FIG. 5 is a simplified block diagram illustrating a configuration example of a voltage monitoring circuit according to an embodiment concerning a voltage monitoring circuit with a counter circuit and a reference register.

In FIG. 5 the voltage interface circuit 210 includes an ohmic voltage divider with a first resistor element R1 and a second resistor element R2 electrically connected in series between a first conductor line supplying the internal constant voltage signal Vcon and a second conductor line supplying a reference potential Vref. The amplitude of the monitored voltage signal Vmon is a fraction of the amplitude of the internal constant voltage signal Vcon. The resistance of the first resistor element R1 and the second resistor element R2 are sufficiently low to allow for detection of high frequency irregularities on Vcon and at the same time sufficiently high to not cause high static power consumption.

The evaluation circuit 230 includes a counter circuit 231 that outputs a count value Cnt indicating a number of complete signal periods (oscillations) of the periodic signal Osc in a predetermined count period. In case the periodic signal Osc is a square wave signal, the counter circuit 231 may count rising and/or trailing edges of the periodic signal Osc.

The count period may be defined by a first timing signal. The first timing signal may be a binary square wave signal, wherein during the predetermined count period the first timing signal is inactive and the counter circuit 231 counts the oscillations of the periodic signal Osc and wherein after each count period an active timing signal resets the counter circuit 231. The counter may have transparent outputs that output "zero" after each reset or may have latched outputs that hold the result of the previous count to beyond the reset condition, e.g. up to the next active period of the first timing signal. The first timing signal may be a periodic signal that changes from inactive to active in regular intervals.

The count value Cnt may be a digital number and the counter circuit 231 may output the digital number or the lower-valued part (LSB part) thereof through a parallel interface.

The predetermined count period may be shorter, e.g. significantly shorter than an image capturing period such that the voltage monitoring circuit is capable of capturing even short critical fluctuations within each image capturing period.

The evaluation circuit 230 further includes a comparison circuit 233 that outputs the notification signal Flg when the count value Cnt indicates a number of signal periods satisfying a predetermined condition in relation to at least one reference count.

The comparison circuit 233 includes a threshold interface for receiving one or two reference counts. In the illustrated embodiment the comparison circuit 233 has a first reference input hi for receiving an upper reference count and a second reference input 1*o* for receiving a lower reference count, and the comparison circuit 233 outputs the notification signal Flg when the count value Cnt indicates a number of signal periods that exceeds the upper reference count or that falls below the lower reference count. According to another embodiment the comparison circuit 233 may include one signal reference input for receiving a set point value, and the comparison circuit 233 outputs the notification signal Flg when the count value Cnt indicates a number of signal periods exceeding a preset tolerance window around the set point value.

The comparison circuit 231 may perform the comparison of the count value with the reference count in response to a second timing signal.

The second timing signal may be a binary square wave signal synchronized with the first timing signal. During the predetermined count period the second timing signal is inactive. After each count period and within the period during which the counter circuit 231 outputs the count value, an active second timing signal triggers the comparison of the count value with the lower and upper reference counts. The second timing signal may be a periodic signal that changes from inactive to active in regular intervals.

The evaluation circuit 230 further includes a reference circuit 234 that passes the at least one reference count to the comparison circuit 233. The reference circuit 234 may hold the at least one reference count in a read-only register or in a rewriteable register. The reference circuit 234 may hold the upper and lower reference count, or may hold the set point value.

The evaluation circuit 230 further includes a timing circuit 232 that generates timing signals for controlling at least one of the counter circuit 231, the comparison circuit 233 and the reference circuit 234 to facilitate a count of the signal periods during the predetermined count period and/or to compare a result of the count with the at least one reference count.

For example, the timing circuit 232 may include a free-running counter resetting automatically after reaching a certain count value. Then the count rate may be rather independent from fluctuations of a supply voltage of the voltage monitoring circuit 200.

The timing circuit 232 may generate and output one or more periodic timing signals. The timing signals are binary square wave signals. In case the timing circuit 232 outputs more than one timing signals, the falling and trailing edges of all timing signals may have a fixed temporal relationship to each other.

The timing circuit 232 includes or does not include a synchronization input for synchronizing the timing signals to a synchronization signal, which may be an external signal or a signal generated by the signal controller 15 in FIG. 1.

The synchronization may be used to monitor quasi-constant square wave signals with active periods longer than the count periods, wherein the start of the count periods may be triggered in response to a rising edge of the quasi-constant square wave.

In FIG. 5, the timing circuit 232 generates and outputs the first timing signal Res to periodically reset the counter circuit 231. In addition, the timing circuit 232 generates and outputs the second timing signal Smp to periodically trigger a comparison in the comparator circuit 233. The first and second timing signals Res and Smp may change synchronously from inactive to active, or the second timing signal Smp may be slightly delayed with respect to the first timing signal Res.

The reference circuit 234 includes a reference register 241 that holds the at least one reference count. The reference register 241 holds the upper and lower reference count or the set point value in a read-only or in a rewriteable register and may permanently pass them to the comparison circuit 233.

Figure 6:
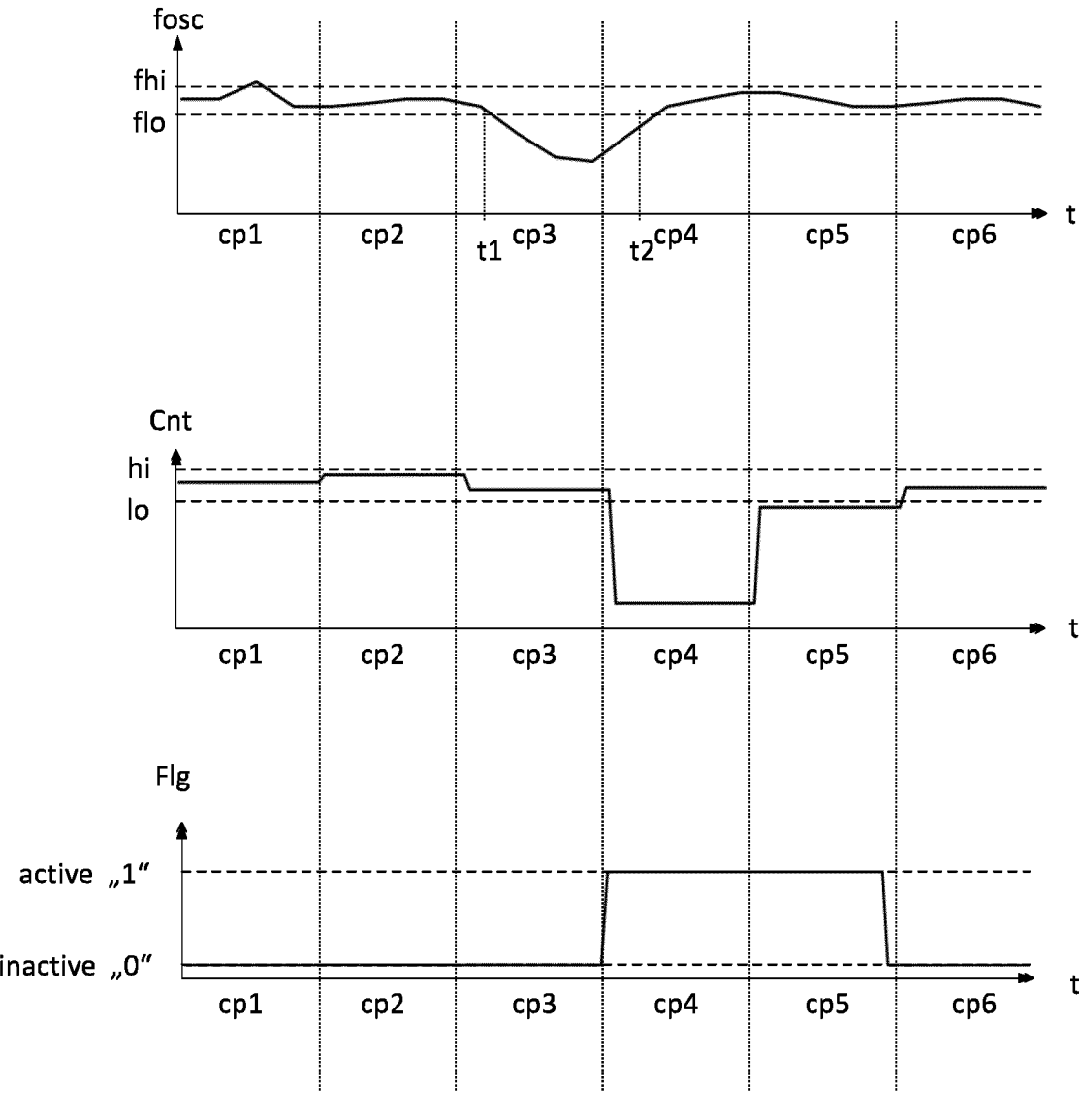
FIG. 6 includes schematic time diagrams to discuss the operation of a voltage monitoring circuit with a counter circuit as shown in FIG. 5.

The topmost time diagram in FIG. 6 shows the frequency fosc of the periodic signal Osc, wherein the frequency fosc images the time response of the input voltage signal Vinp and drops below the lower frequency threshold flo between t=t1 and t=t2. The time axis shows start and end of consecutive count periods cp1, cp2, . . . , cp6.

The time diagram in the middle of FIG. 6 shows the respective count values Cnt of a counter circuit 231 with latched output. The count value Cnt relates to the average value of the number of oscillations of the periodic signal Osc during one count period. For each complete count period, the counter circuit 231 outputs the result of the previous count.

For example, during count period cp2 the count value Cut shows the result for the first count period cp1. The main part of the voltage dip between t=t1 and t=t2 falls in the third count period cp3. Accordingly, for the fourth count period cp4 the counter circuit 231 outputs a number of oscillations significantly below the lower reference count lo. A smaller part of the voltage dip falls in the fourth count period cp4. Accordingly, in the fifth period cp5 the counter circuit 231 outputs a number of oscillations just below the lower reference count lo. Such voltage spikes and voltage dips which are significantly shorter than one count period are typically not detected.

For example, the nominal frequency of the voltage controlled oscillator 220 may be in a range from 50 kHz to 500 kHz, e.g. between 80 kHz and 200 kHz, or approximately 100 kHz. A typical count value for the ideal case may be between 50 and 200 counts, e.g. approximately 100 counts. The count period may be between 0.5 ms and 5 ms, e.g. about 1 ms.

The comparison may take place at the end or shortly after each count period. The time diagram at the bottom of FIG. 6 shows the notification signal Flg being active for the fourth and fifth count periods cp4, cp5.

Figure 7:
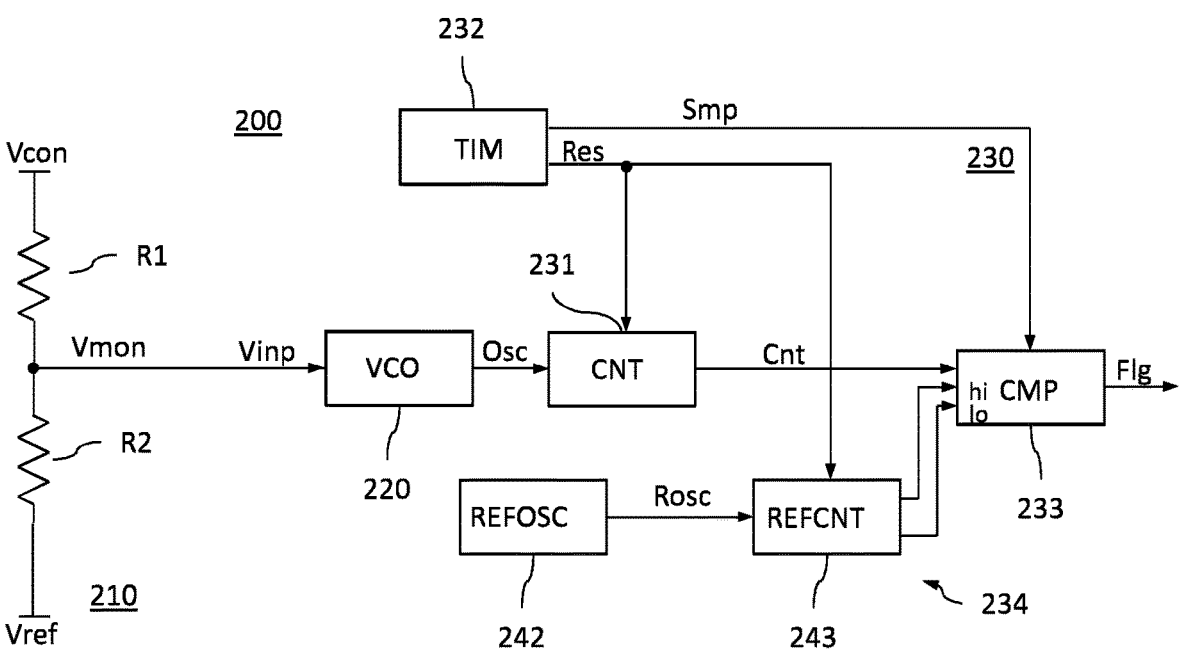
FIG. 7 is a simplified block diagram illustrating a configuration example of a voltage monitoring circuit according to an embodiment with a reference counter circuit.

FIG. 7 shows a voltage monitoring circuit 200 with the reference circuit 234 including a reference oscillator circuit 242. The reference oscillator circuit 242 outputs a periodic reference signal Rosc, wherein a frequency of the periodic reference signal Rose depends on a temperature of the voltage controlled oscillator 220. The evaluation circuit 230 modifies the at least one reference count in response to a change of the frequency of the periodic reference signal Rosc.

The reference oscillator circuit 242 may include a free-running counter that may use a stable voltage reference. According to another example, the reference oscillator circuit 242 may include a crystal oscillator, wherein the crystal oscillator provides high frequency stability. For example, the reference oscillator circuit 242 may include a crystal oscillator used also for another purpose outside the voltage monitoring circuit 200.

The voltage controlled oscillator 220 and the reference oscillator circuit 242, e.g. a crystal oscillator of the reference oscillator circuit 242, may be thermally strongly coupled. In addition, the frequency of the reference oscillator circuit 242 and the frequency of the voltage controlled oscillator 220 may have the same or approximately the same temperature dependence. Then a temperature drift of the frequency of the periodic signal Osc may be at least partly compensated by modifying the at least one reference count by an amount that depends on the frequency of the periodic reference signal Rosc.

For example, the reference circuit 234 may further include a reference counter circuit 243. The reference counter circuit 243 determines a reference count value that indicates a number of signal periods of the periodic reference signal in a predetermined time interval and modifies the at least one reference count in response to the reference count value.

The predetermined time interval may be set by a timing signal of the timing circuit 232, wherein the timing signal periodically resets the reference counter circuit 243.

The predetermined time interval for the reference counter circuit 243 and the count period for the counter circuit 220 may be equal. For example, the first timing signal Res may be used to reset synchronously the counter circuit 231 and the reference counter circuit 243. The nominal frequencies of the voltage controlled oscillator 220 and the reference oscillator circuit 242 may be equal.

The at least one reference count used in the comparator circuit 233 follows the temperature dependency of the frequency of the periodic reference signal Rose and automatically compensates for a temperature drift of the voltage controlled oscillator 220.

Figure 8:
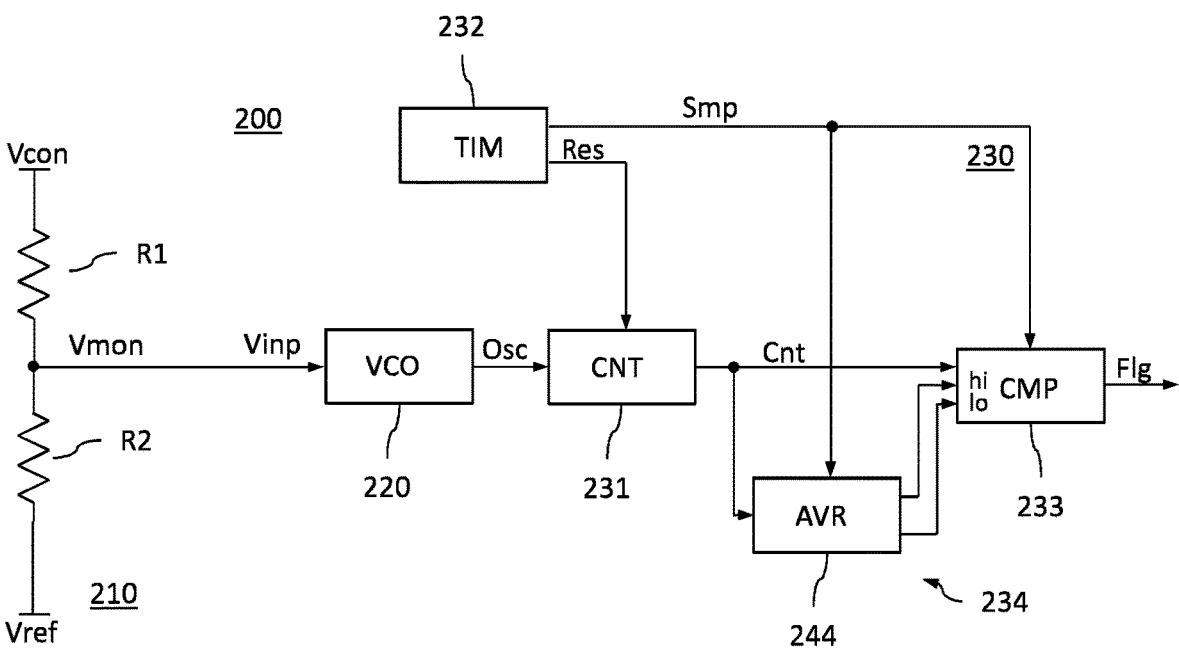
FIG. 8 is a simplified block diagram illustrating a configuration example of a voltage monitoring circuit according to an embodiment with a dynamic register circuit.

In FIG. 8, the reference circuit 234 includes a dynamic register circuit 244 that determines the at least one reference count as a function of one or more previous count values. For example, the dynamic register circuit 244 may use a number of directly preceding count values to calculate a weighted average across a predetermined number of previous count values to obtain the reference counts for the current count period. The weights may be equal or may decrease with increasing temporal distance to the current count period.

The timing circuit 232 periodically triggers an update of the reference count by the dynamic register circuit 244. For example, the second timing signal Smp may be used to trigger synchronously the update in the dynamic register circuit 244 and the comparison in the comparison circuit 233.

If the temperature of the voltage controlled oscillator 220 changes slowly compared to fluctuations of the monitored voltage, a running average across a sufficient number of count periods reflects the temperature drift of the frequency of the periodic signal Osc and can be efficiently used to compensate a temperature drift of the voltage controlled oscillator 220.

Figure 9:
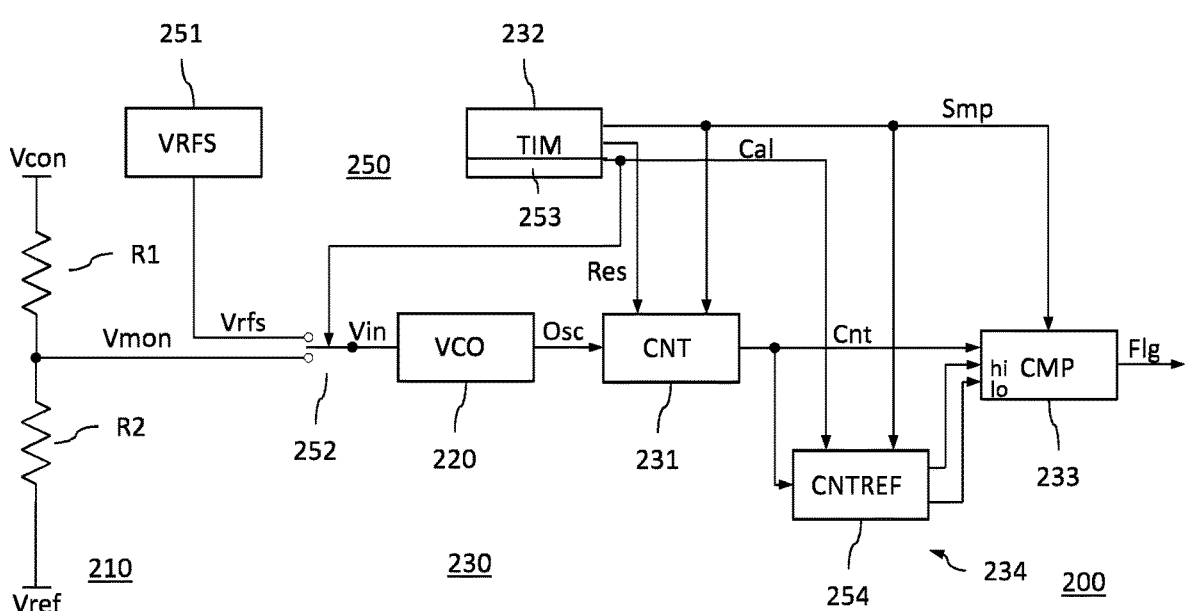
FIG. 9 is a simplified block diagram illustrating a configuration example of a voltage monitoring circuit according to an embodiment concerning a self-calibrating voltage monitoring circuit.

FIG. 9 refers to an embodiment with the reference circuit 234 including a calibration circuit 250 that obtains the at least one reference count from a periodic calibration signal output from the voltage controlled oscillator 220 when a reference voltage signal Vrfs is applied to the oscillator input. This allows the voltage monitoring circuit 200 to calibrate itself against a known voltage.

For example, the reference voltage signal Vrfs is supplied to the oscillator input for a calibration period. The calibration period may last one complete count period. The count value that the voltage controlled oscillator outputs for the calibration period represents the set count value under the current ambient temperature and may be directly used as set point value for the following count periods.

In particular, the calibration circuit 250 may include a reference voltage source 251 that generates the reference voltage signal Vrfs.

The reference voltage source 251 may include a bandgap reference that temporarily applies the reference voltage signal Vrfs to the oscillator input for a calibration period. The reference voltage source 251 produces a temperature-stable reference voltage signal Vrfs against which the voltage monitoring circuit 200 will calibrate periodically or as needed.

In addition, in the voltage interface circuit 210, the resistances R1 and R2 may be scaled such that the monitored voltage signal Vmon equals the reference voltage signal Vrfs under ideal conditions.

The calibration circuit 250 may determine the at least one reference count from a calibration run of the voltage controlled oscillator 220 with the reference voltage signal Vrfs applied to the oscillator input of the voltage controlled oscillator 220.

The calibration circuit 250 may store the result of the calibration run as calibration count in a calibration register 254 that may add an upper and lower margin to the calibration count to generate the upper reference count hi and the lower reference count lo.

To this purpose, the calibration circuit 250 may include a controllable switch 252 that alternatingly passes the reference voltage signal Vrfs and a monitored voltage signal Vmon to the oscillator input of the voltage controlled oscillator 220, wherein the monitored voltage signal Vmon is derived from the internal constant voltage signal Vcon.

The calibration circuit 250 may further include a calibration timing circuit 253 that synchronizes the calibration run of the voltage controlled oscillator 220 and the setting of a calibration register 254 that stores the at least one reference count obtained from the calibration run.

The calibration timing circuit 253 periodically triggers a calibration run. For example, the calibration timing circuit 253 generates and outputs a third timing signal Cal that terminates the calibration run by synchronously switching the monitored voltage signal Vmon to the oscillator input and latching the count value of the current count period into the calibration register 254.

The timing signals Res, Smp of the timing circuit 232 and the timing signal Cal of the calibration timing circuit 253 co-operate as follows, wherein active signals are assumed to have "high" voltage level, inactive signals are assumed to have "low" voltage level, "rising edge" refers to a transition from inactive to active and "trailing edge" refers to a transition from active to inactive.

An active ("high") first timing signal Res (reset pulse) initiates each count period, wherein the rising or falling edge of the first timing signal Res may trigger both the start of the count period and the latch of the result of the previous count at the data output(s) of the counter circuit 231.

When all timing signals Res, Smp, Cal are inactive ("low"), the monitored voltage Vmon is passed to the oscillator input and the counter circuit 231 counts the oscillations of the periodic signal Osc controlled by the monitored voltage signal Vmon.

An active ("high") second timing signal Smp (sample pulse) initiates comparison of the current count value at the data output(s) of the counter circuit 231 with the current at least one reference counts at the data output(s) of the calibration register 254. In addition, an active ("high") second timing signal Smp may halt the count such that the count value can be safely read-out from the counter circuit 231.

An active ("high") third timing signal Cal initiates and indicates a calibration run. For example, the rising or falling edge of the third timing signal Cal may trigger the start of the calibration period, in which the voltage monitoring circuit 200 counts the oscillations of the periodic signal Osc, when the reference voltage signal Vrfs is applied to the oscillator input.

With the third timing signal Cal being still active ("high"), an active ("high") second timing signal Smp initiates an update of the reference count in the calibration register 254. For example, the rising or falling edge of the second timing signal Smp may trigger the transfer ("latch") of the result of the count value of the calibration period into the calibration register 254.

Figure 10:
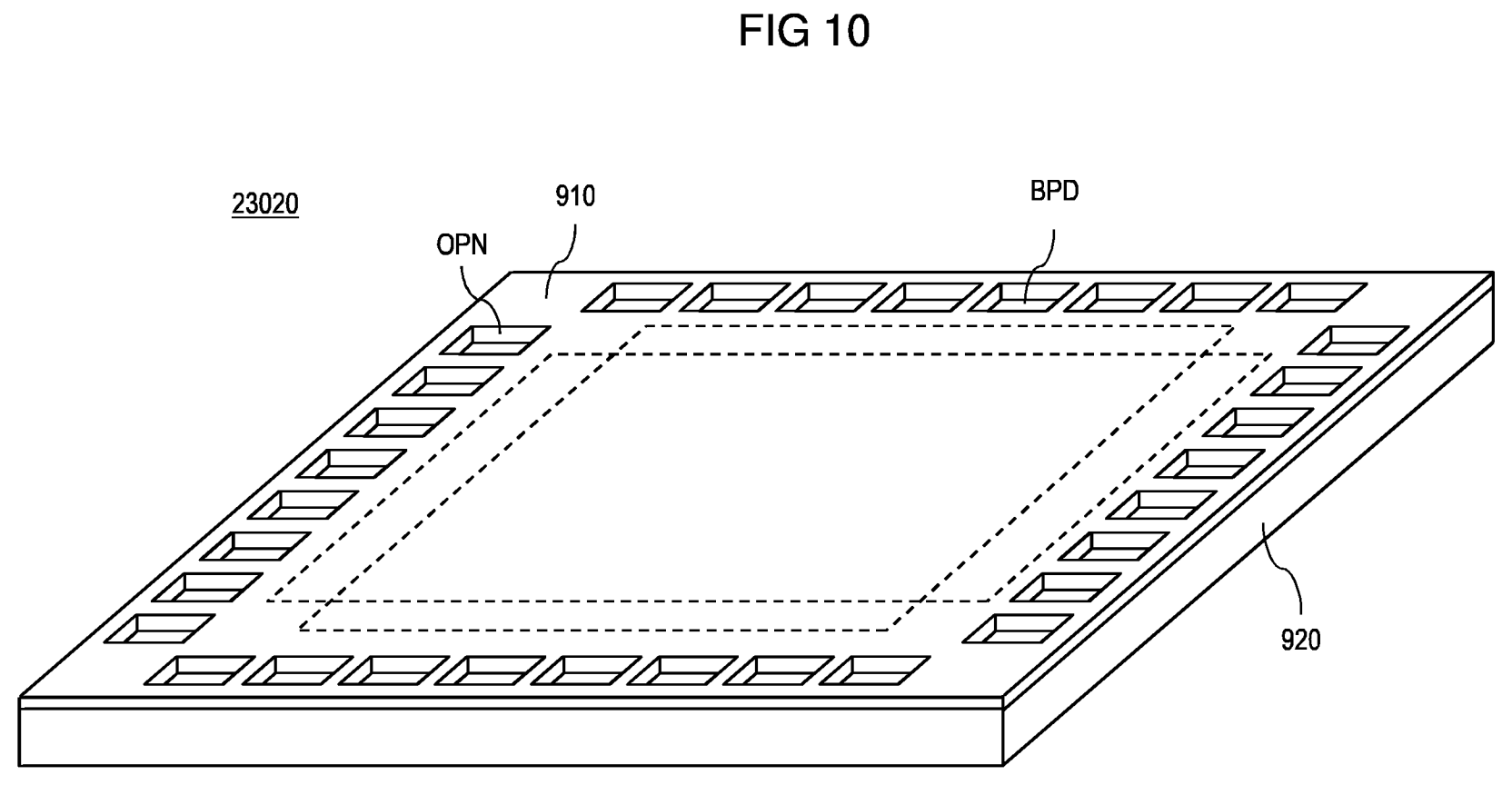

FIG. 10 is a perspective view showing an example of a laminated structure of a solid-state imaging device 23020 with a plurality of pixels arranged matrix-like in array form. Each pixel includes at least one photoelectric conversion element.

The solid-state imaging device 23020 has the laminated structure of a first chip (upper chip) 910 and a second chip (lower chip) 920. The laminated first and second chips 910, 920 may be electrically connected to each other through TC(S)Vs (Through Contact (Silicon) Vias) formed in the first chip 910. The solid-state imaging device 23020 may be formed to have the laminated structure in such a manner that the first and second chips 910 and 920 are bonded together at wafer level and cut out by dicing.

In the laminated structure of the upper and lower two chips, the first chip 910 may be an analog chip (sensor chip) including at least one analog component of each pixel circuit, e.g., the photoelectric conversion elements arranged in array form.

For example, the first chip 910 may include only the photoelectric conversion elements of the pixel circuits as described above with reference to the preceding FIGS. Alternatively, the first chip 910 may include further elements of each pixel circuit. For example, the first chip 910 may include, in addition to the photoelectric conversion elements, at least the transfer transistor, the reset transistor, the amplifier transistor, and/or the selection transistor of the pixel circuits. Alternatively, the first chip 910 may include each element of the pixel circuit.

The second chip 920 may be mainly a logic chip (digital chip) that includes the elements complementing the elements on the first chip 910 to complete pixel circuits and current control circuits. The second chip 920 may also include analog circuits, for example circuits that quantize analog signals transferred from the first chip 910 through the TCVs. For example, the second chip 920 may include all or at least some of the components of the row driver assembly.

The second chip 920 may have one or more bonding pads BPD and the first chip 910 may have openings OPN for use in wire-bonding to the second chip 920. The solid-state imaging device 23020 with the laminated structure of the two chips 910, 920 may have the following characteristic configuration:

The electrical connection between the first chip 910 and the second chip 920 is performed through, for example, the TCVs. The TCVs may be arranged at chip ends or between a pad region and a circuit region. The TCVs for transmitting control signals and supplying power may be mainly concentrated at, for example, the four corners of the solid-state imaging device 23020, by which a signal wiring area of the first chip 910 can be reduced.

The technology according to the present disclosure may be realized in a light receiving device mounted in a mobile body of any type such as automobile, electric vehicle, hybrid electric vehicle, motorcycle, bicycle, personal mobility, airplane, drone, ship, or robot.

Figure 11:
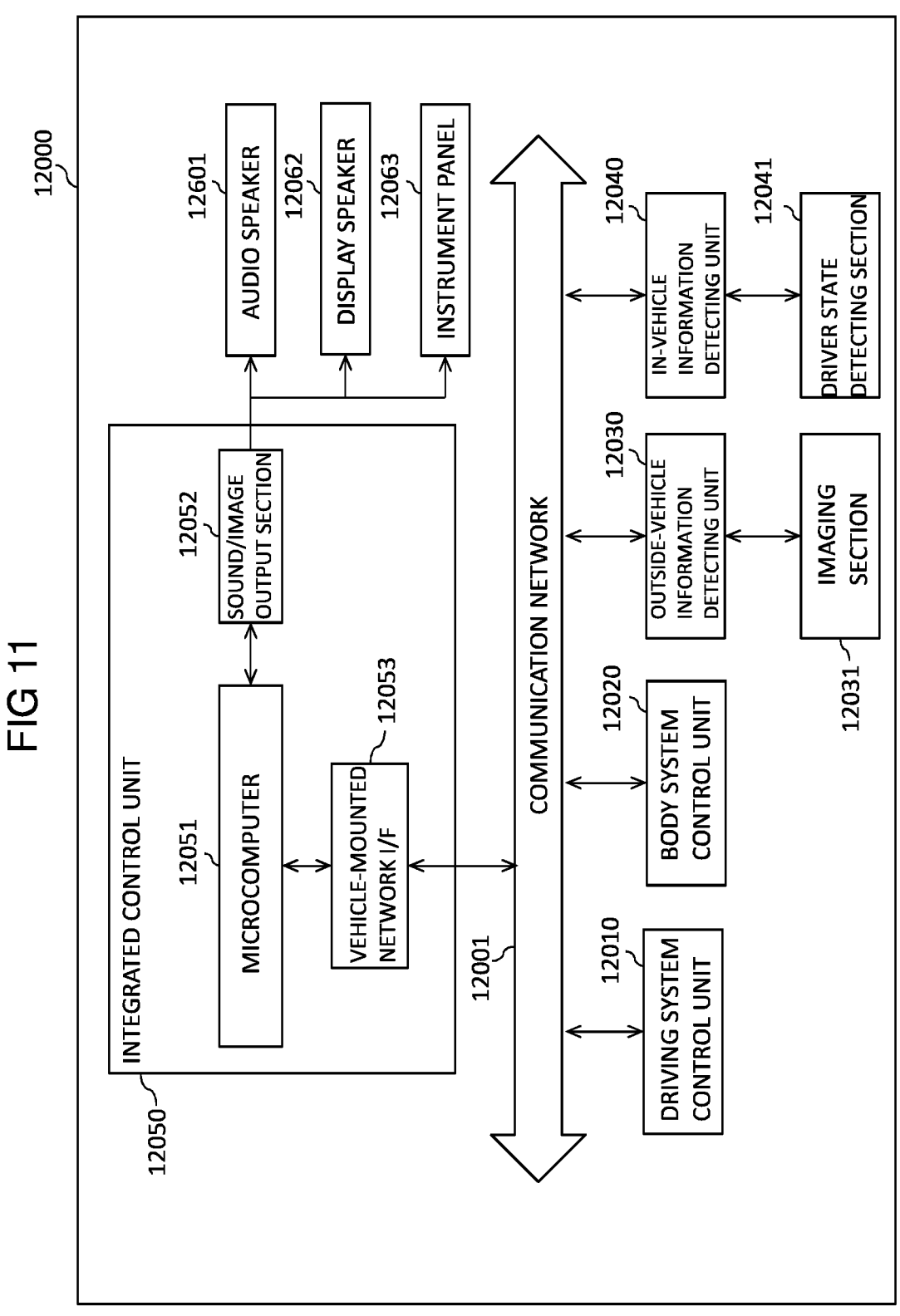
FIG. 11 is a block diagram depicting an example of a schematic configuration of a vehicle control system.

FIG. 11 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 11, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 imaging an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 may be or may include an image sensor with a voltage monitoring circuit using a voltage controlled oscillator according to the embodiments of the present disclosure. The light received by the imaging section 12031 may be visible light, or may be invisible light such as infrared rays or the like.

The in-vehicle information detecting unit 12040 detects information about the inside of the vehicle and may be or may include a solid-state imaging device with a raw driver assembly according to the embodiments of the present disclosure. The in-vehicle information detecting unit 12040 is, for example, connected with a driver state detecting section 12041 that detects the state of a driver. The driver state detecting section 12041, for example, includes a camera that includes the solid-state imaging device and that is focused on the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound or an image to an output device capable of visually or audible notifying information to an occupant of the vehicle or the outside of the vehicle. In the example of FIG. 11, an audio speaker 12061, a display section 12062, and an instrument panel 12063 are illustrated as the output device. The display section 12062 may, for example, include at least one of an on-board display or a head-up display, wherein each of them may include a solid-state imaging device using a latch comparator circuit for event detection.

Figure 12:
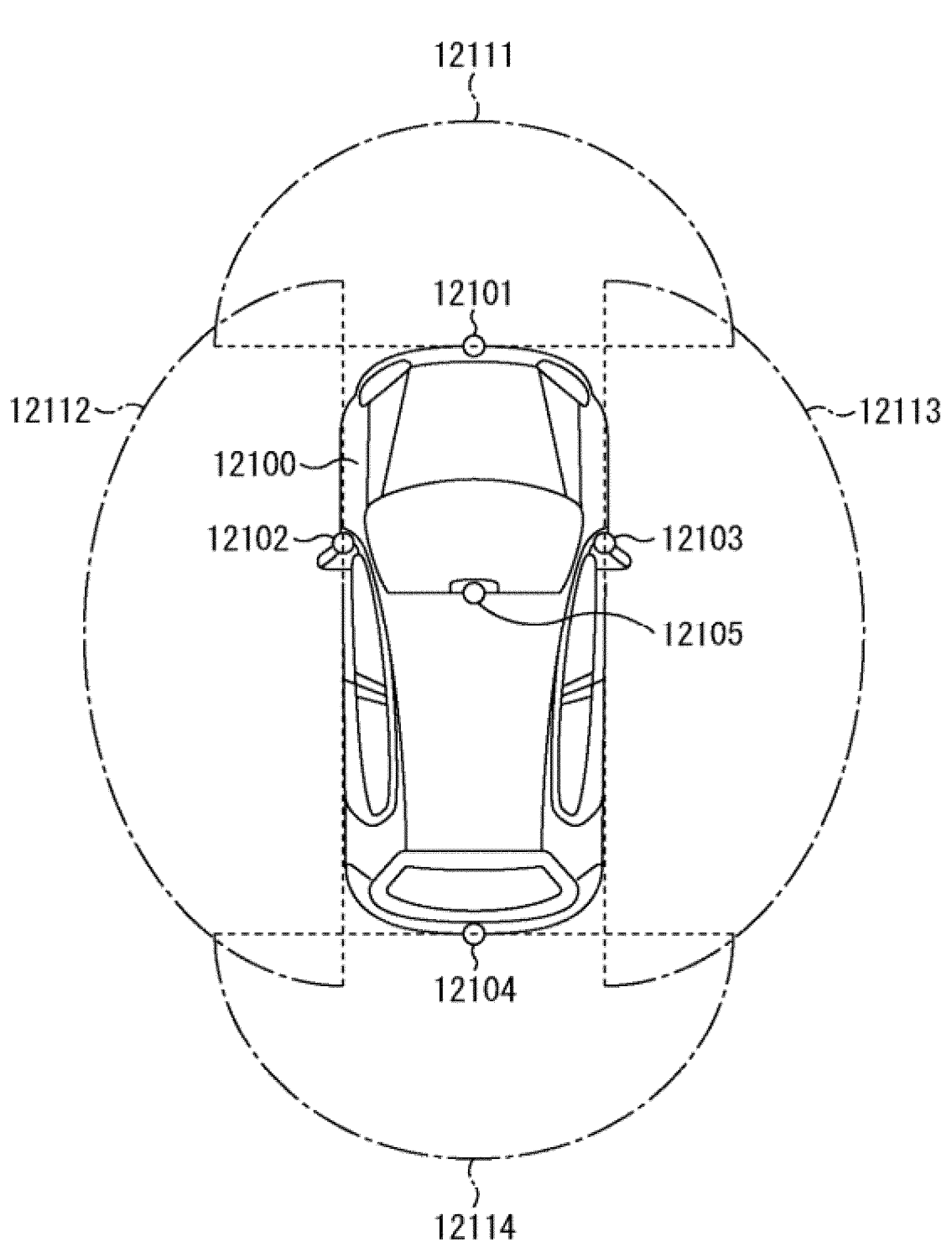
FIG. 12 is a diagram of assistance in explaining an example of installation positions of an outside-vehicle information detecting section and an imaging section of the vehicle control system of FIG. 11.

FIG. 12 is a diagram depicting an example of the installation position of the imaging section 12031, wherein imaging section 12031 may include imaging sections 12101, 12102, 12103, 12104, and 12105.

The imaging sections 12101, 12102, 12103, 12104, and 12105 are, for example, disposed at positions on a front nose, side-view mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the side view mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 12 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the side view mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, imaging element having pixels for phase difference detection or may include a ToF module including an image sensor with a voltage monitoring circuit according to the present disclosure.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The example of the vehicle control system to which the technology according to an embodiment of the present disclosure is applicable has been described above. By applying image sensors with a safety controller including a voltage monitoring circuit according to the embodiments, the assessment of the captured images can consider information about possibly defect pixels. For example, recognition of pedestrians can be performed on more reliable pixel information. A faulty image sensor can be reliably detected and reported to a higher instance.

Additionally, embodiments of the present technology are not limited to the above-described embodiments, but various changes can be made within the scope of the present technology without departing from the gist of the present technology.

A solid-state imaging device including the image sensor with voltage monitoring circuit according to the present disclosure may be any device used for analyzing and/or processing radiation such as visible light, infrared light, ultraviolet light, and X-rays. For example, the solid-state imaging device may be any electronic device in the field of traffic, the field of home appliances, the field of medical and healthcare, the field of security, the field of beauty, the field of sports, the field of agriculture, the field of image reproduction or the like.

Specifically, in the field of image reproduction, the solid-state imaging device may be a device for capturing an image to be provided for appreciation, such as a digital camera, a smart phone, or a mobile phone device having a camera function. In the field of traffic, for example, the solid-state imaging device may be integrated in an in-vehicle sensor that captures the front, rear, peripheries, an interior of the vehicle, etc. for safe driving such as automatic stop, recognition of a state of a driver, or the like, in a monitoring camera that monitors traveling vehicles and roads, or in a distance measuring sensor that measures a distance between vehicles or the like.

In the field of home appliances, the solid-state imaging device may be integrated in any type of sensor that can be used in devices provided for home appliances such as TV receivers, refrigerators, and air conditioners to capture gestures of users and perform device operations according to the gestures. Accordingly the solid-state imaging device may be integrated in home appliances such as TV receivers, refrigerators, and air conditioners and/or in devices controlling the home appliances. Furthermore, in the field of medical and healthcare, the solid-state imaging device may be integrated in any type of sensor, e.g. a solid-state image device, provided for use in medical and healthcare, such as an endoscope or a device that performs angiography by receiving infrared light.

In the field of security, the solid-state imaging device can be integrated in a device provided for use in security, such as a monitoring camera for crime prevention or a camera for person authentication use. Furthermore, in the field of beauty, the solid-state imaging device can be used in a device provided for use in beauty, such as a skin measuring instrument that captures skin or a microscope that captures a probe. In the field of sports, the solid-state imaging device can be integrated in a device provided for use in sports, such as an action camera or a wearable camera for sport use or the like. Furthermore, in the field of agriculture, the solid-state imaging device can be used in a device provided for use in agriculture, such as a camera for monitoring the condition of fields and crops.

Note that the present technology can also be configured as described below:

(1) An image sensor, including: a voltage controlled oscillator configured to output a periodic signal, wherein a frequency of the periodic signal is a function of an input voltage signal at an oscillator input, and wherein the input voltage signal is derived from an internal constant voltage signal of the image sensor; and an evaluation circuit configured to output a notification signal when a frequency of the periodic signal fulfills a predetermined condition.

(2) The image sensor according to (1), further including: a pixel circuit, wherein the internal constant voltage signal is used to control the pixel circuit and/or to analyze a pixel output signal of the pixel circuit; and a voltage interface circuit configured to derive the input voltage signal from the internal constant voltage signal.

(3) The image sensor according to any of (1) and (2), wherein the evaluation circuit includes a counter circuit configured to output a count value indicating a number of signal periods of the periodic signal in a predetermined count period.

(4) The image sensor according to (3), wherein the evaluation circuit includes a comparison circuit configured to output the notification signal when the count value indicates a number of signal periods satisfying a predetermined condition in relation to at least one reference count.

(5) The image sensor according to (4), wherein the evaluation circuit includes a reference circuit configured to pass the at least one reference count to the comparison circuit.

(6) The image sensor according to any of (3) to (5), wherein the evaluation circuit includes a timing circuit configured to generate timing signals for controlling at least one of the counter circuit, the comparison circuit and the reference circuit to facilitate a count of the signal periods during the predetermined count period and/or to compare a result of the count with the at least one reference count.

(7) The image sensor according to (5), wherein the reference circuit includes a reference register configured to hold the at least one reference count.

(8) The image sensor according to any of (5) and (6), wherein the reference circuit includes a reference oscillator circuit configured to output a periodic reference signal, wherein a frequency of the periodic reference signal depends on a temperature of the voltage controlled oscillator, and wherein the evaluation circuit is further configured to modify the at least one reference count in response to a change of the frequency of the periodic reference signal.

(9) The image sensor according to (8), wherein the reference circuit further includes a reference counter circuit configured to determine a reference count value indicating a number of signal periods of the periodic reference signal in a predetermined time interval and to modify the at least one reference count in response to the reference count value.

(10) The image sensor according to any of (5) and (6), wherein the reference circuit includes a dynamic register circuit configured to determine the at least one reference count as a function of one or more previous count values.

(11) The image sensor according to (5), wherein the reference circuit includes a calibration circuit configured to obtain the at least one reference count from a periodic calibration signal output by the voltage controlled oscillator when a reference voltage signal is applied to the oscillator input

(12) The image sensor according to (11), wherein the calibration circuit includes a reference voltage source configured to generate the reference voltage signal.

(13) The image sensor according to any of (11) and (12), wherein the calibration circuit is configured to determine the at least one reference count from a calibration run of the voltage controlled oscillator with the reference voltage signal applied to the oscillator input.

(14) The image sensor according to any of (11) to (13), wherein the calibration circuit includes a controllable switch configured to alternatingly pass the reference voltage signal and a monitored voltage signal obtained from the internal constant voltage signal to the oscillator input.

(15) The image sensor according to any of (13) and (14), wherein the calibration circuit includes a calibration timing circuit configured to synchronize the calibration run of the voltage controlled oscillator and a setting of a calibration register that stores the at least one reference count obtained from the calibration run.

The invention claimed is:

1. An image sensor, comprising:
a voltage controlled oscillator configured to output a periodic signal, wherein a frequency of the periodic signal is a function of an input voltage signal at an oscillator input, and wherein the input voltage signal (Vinp) is derived from an internal constant voltage signal of the image sensor;
a voltage interface circuit configured to derive the input voltage signal from the internal constant voltage signal, the voltage interface circuit comprising a first resistor and a second resistor connected in series between the internal constant voltage signal and a reference potential; and
an evaluation circuit configured to output a notification signal when a frequency of the periodic signal fulfills a predetermined condition.

2. The image sensor according to claim 1, further comprising:
a pixel circuit, wherein the internal constant voltage signal is used to control the pixel circuit and/or to analyze a pixel output signal of the pixel circuit.

3. The image sensor according to claim 1,
wherein the evaluation circuit comprises a counter circuit configured to output a count value indicating a number of signal periods of the periodic signal in a predetermined count period.

4. The image sensor according to claim 3,
wherein the evaluation circuit comprises a comparison circuit configured to output the notification signal when the count value indicates a number of signal periods satisfying a predetermined condition in relation to at least one reference count.

5. The image sensor according to claim 4,
wherein the evaluation circuit comprises a reference circuit configured to pass the at least one reference count to the comparison circuit.

6. The image sensor according to claim 5,
wherein the evaluation circuit comprises a timing circuit configured to generate timing signals for controlling at least one of the counter circuit, the comparison circuit, and the reference circuit to facilitate a count of the signal periods during the predetermined count period and/or to compare a result of the count with the at least one reference count.

7. The image sensor according to claim 5,
wherein the reference circuit comprises a reference register configured to hold the at least one reference count.

8. The image sensor according to claim 5,
wherein the reference circuit comprises a reference oscillator circuit configured to output a periodic reference signal, wherein a frequency of the periodic reference signal depends on a temperature of the voltage controlled oscillator, and wherein the evaluation circuit is further configured to modify the at least one reference count in response to a change of the frequency of the periodic reference signal.

9. The image sensor according to claim 8,
wherein the reference circuit further comprises a reference counter circuit configured to determine a reference count value indicating a number of signal periods of the periodic reference signal in a predetermined time interval and to modify the at least one reference count in response to the reference count value.

10. The image sensor according to claim 5,
wherein the reference circuit comprises a dynamic register circuit configured to determine the at least one reference count as a function of one or more previous count values.

11. The image sensor according to claim 5,
wherein the reference circuit comprises a calibration circuit configured to obtain the at least one reference count from a periodic calibration signal output by the voltage controlled oscillator when a reference voltage signal is applied to the oscillator input.

12. The image sensor according to claim 11,
wherein the calibration circuit comprises a reference voltage source configured to generate the reference voltage signal.

13. The image sensor according to claim 11,
wherein the calibration circuit is configured to determine the at least one reference count from a calibration run of the voltage controlled oscillator with the reference voltage signal applied to the oscillator input.

14. The image sensor according to claim 11,
wherein the calibration circuit comprises a controllable switch configured to alternatingly pass the reference voltage signal and a monitored voltage signal obtained from the internal constant voltage signal to the oscillator input, wherein the monitored voltage signal is derived from the internal constant voltage signal via the voltage interface circuit comprising the first resistor and the second resistor connected in series.

15. The image sensor according to claim 13,
wherein the calibration circuit comprises a calibration timing circuit configured to synchronize the calibration run of the voltage controlled oscillator and a setting of a calibration register that stores the at least one reference count obtained from the calibration run.

16. The image sensor according to claim 1,
wherein resistance values of the first resistor and the second resistor allow for detection of high-frequency irregularities on the internal constant voltage signal while limiting static power consumption of the image sensor below a predetermined threshold.

17. An image sensor, comprising:
a voltage controlled oscillator configured to output a periodic signal, wherein a frequency of the periodic signal is a function of an input voltage signal at an oscillator input, and wherein the input voltage signal (Vinp) is derived from an internal constant voltage signal of the image sensor; and
an evaluation circuit configured to output a notification signal when a frequency of the periodic signal fulfills a predetermined condition,
wherein the voltage controlled oscillator is further configured to operate at a nominal frequency between 80 kHz and 200 kHz.

18. An image sensor, comprising:
a voltage controlled oscillator configured to output a periodic signal, wherein a frequency of the periodic signal is a function of an input voltage signal at an oscillator input;
a calibration circuit configured to obtain a reference count from a periodic calibration signal output by the voltage controlled oscillator in response to a reference voltage signal is applied to the oscillator input;
a controllable switch configured to alternatingly pass the reference voltage signal and a monitored voltage signal to the oscillator input, wherein the monitored voltage signal is derived from an internal constant voltage signal of the image sensor; and an evaluation circuit configured to generate a notification signal when a count value of the periodic signal fulfills a predetermined condition in relation to the reference count, wherein the notification signal is used to assess a quality of a captured image.

19. The image sensor according to claim 18, wherein the monitored voltage signal is derived from the internal constant voltage signal via a voltage interface circuit comprising a first resistor and a second resistor connected in series.

20. The image sensor according to claim 18, further comprising:

a voltage interface circuit configured to derive the input voltage signal from the internal constant voltage signal, the voltage interface circuit comprising a first resistor and a second resistor connected in series between the internal constant voltage signal and a reference potential, wherein resistance values of the first resistor and the second resistor allow for detection of high-frequency irregularities on the internal constant voltage signal while limiting static power consumption of the image sensor below a predetermined threshold.

* * * * *